US005254434A

United States Patent [19]

Uytterhoeven et al.

[11] Patent Number: 5,254,434

[45] Date of Patent: Oct. 19, 1993

[54] METHOD OF FORMING THERMAL TRANSFER DYE IMAGES

[75] Inventors: Herman J. Uytterhoeven, Bonheiden; Joan T. Vermeersch, Deinze; Daniël M. Timmerman; Marcel J. Monbaliu, both of Mortsel, all of Belgium

[73] Assignee: Agfa-Gevaert, N.V., Mortsel, Belgium

[21] Appl. No.: 783,243

[22] Filed: Oct. 28, 1991

[30] Foreign Application Priority Data

Oct. 30, 1990 [EP] European Pat. Off. ........ 90202872.9

[51] Int. Cl.[5] .................................... G03F 7/34

[52] U.S. Cl. .................................... 430/203; 430/200; 430/201; 503/227

[58] Field of Search ............... 430/201, 203, 254, 252, 430/260, 200; 503/227

[56] References Cited

U.S. PATENT DOCUMENTS

| | | | |
|---|---|---|---|
| 3,073,699 | 1/1963 | Firestine | 430/524 |
| 3,245,796 | 4/1966 | Burg | 430/201 |
| 4,587,198 | 5/1986 | Fisch | 430/203 |
| 4,614,521 | 9/1986 | Niwa et al. | 430/201 |
| 4,766,052 | 8/1988 | Nakamura et al. | 430/203 |
| 4,847,188 | 7/1989 | Komamura et al. | 430/203 |
| 4,855,282 | 8/1989 | Satomura et al. | 428/913 |
| 5,166,129 | 11/1992 | Shuttleworth et al. | 503/227 |

FOREIGN PATENT DOCUMENTS

| | | | |
|---|---|---|---|
| 0209991 | 1/1987 | European Pat. Off. | 503/227 |
| 0362827 | 4/1990 | European Pat. Off. | 430/201 |

*Primary Examiner*—Charles L. Bowers, Jr.
*Assistant Examiner*—Martin Angebranndt
*Attorney, Agent, or Firm*—Breiner & Breiner

[57] ABSTRACT

Method of forming thermal transfer dye images comprising exposing a recording element comprising at least one layer of an organic photochemical imaging composition comprising a heat-diffusible dye (precursor) monomer, said layer being permeable to said dye (precursor) monomer, to an image-wise distribution of actinic radiation to create a change in its permeability corresponding to said image-wise distribution of actinic radiation, wherein said change in permeability is brought about by the radiation-induced polymerization or crosslinking reaction of said organic photochemical imaging composition combined with a concurrent copolymerization or crosslinking reaction of said heat-diffusible dye (precursor) monomer, bringing said recording element in contact with an image-receiving element, overall heating at least one of said contacting elements to cause diffusion of the heat-diffusible dye (precursor) monomer from the areas having unchanged permeability and transfer to said image-receiving element, causing in the case of said dye precursor monomer reaction of said transferred dye precursor monomer with a reagent present in said recording element, in said image-receiving element, or in a fluid medium applied to said image-receiving element, to convert said transferred dye precursor monomer into a dye. The invention also provides a recording element for use according to this method.

3 Claims, No Drawings

METHOD OF FORMING THERMAL TRANSFER DYE IMAGES

BACKGROUND OF THE INVENTION

1. Field of the Invention

The present invention relates to an improved method of forming thermal transfer dye images by means of recording elements comprising heat-diffusible dye or heat-diffusible dye precursor.

2. Description of the Prior Art

Several methods are known for transferring heat-diffusible dye from an overall heated element comprising such dye in combination with an image-wise distribution of photopolymerized areas and unpolymerized areas onto a receiving element, the photopolymerized areas inhibiting or reducing the diffusion of the dye to the receiving element.

It is for instance known from U.S. Pat. No. 3,245,796 to use a photopolymerizable element comprising a mixture of an $\alpha,\beta$-ethylenically unsaturated compound and a sublimable dye for forming by photo-initiated addition polymerization of said $\alpha,\beta$-ethylenically unsaturated compound a mask containing insoluble areas, through which the passage of the sublimable dye is impeded, and to overall heat the mask-containing element while in contact with a receptor surface so that transfer of the sublimable dye from the non-polymerized areas to the contacting receptor surface can take place.

In U.S. Pat. No. 4,587,198 a process has been described for providing a colour image comprising exposing a photoresist-type material comprising in the order given a support, a vapour-deposited dye or pigment layer, and a radiation-sensitive coating to an image-wise distribution of radiation that alters the solubility and/or permeability of said coating and uniformly heating said material while in contact with a receptor to evaporate said sublimable dye or pigment and deposit it on the contacting receptor.

In EP-A 362,827 an image-forming method has been described, which comprises the steps of using an image-forming medium containing a heat-diffusible colouring matter, a polymerizable polymer precursor, and a polymerization initiator, causing the polymerizable polymer precursor to image-wise polymerize, and heating the imaged medium while in contact with a receiving medium to diffusion-transfer the heat-diffusible colouring matter thereto, the heating being such as to satisfy the formula $Tg1 \leqq Ttrans \leqq Tg2$, wherein Ttrans represents the temperature of the image-forming medium, Tg1 represents the glass transition temperature of unpolymerized areas, and Tg2 the glass transition temperature of polymerized areas.

The prior art materials and methods used so far often have the disadvantage of providing an unwanted hue or fog in the background areas.

SUMMARY OF THE INVENTION

It is therefore an object of the present invention to provide an improved method of forming thermal transfer dye images by means of recording elements comprising heat-diffusible dye or heat-diffusible dye precursor, said dye images having a reduced level of unwanted fog in the background areas.

This and other objects of the present invention are achieved by providing a method of forming thermal transfer dye images comprising the steps of:

exposing a recording element comprising a support having thereon at least one layer of an organic photochemical imaging composition comprising a homogeneously distributed heat-diffusible dye monomer or dye precursor monomer, said layer being permeable to said dye monomer or dye precursor monomer, to an image distribution of actinic radiation to create in said layer a change in its permeability corresponding to said image-wise distribution of actinic radiation, wherein said change in permeability is brought about by the radiation-induced polymerization or crosslinking reaction of said organic photochemical imaging composition combined with a concurrent copolymerization or crosslinking reaction of said heat-diffusible dye monomer or dye precursor monomer, bringing said recording element having an image-wise changed permeability into contact with an image-receiving element, overall heating at least one of said contacting elements to cause the heat-diffusible dye monomer or dye precursor monomer to diffuse from the areas having unchanged permeability and transfer to said image-receiving element, optionally mordanting the transferred dye monomer on said image-receiving element, causing—in the case of said dye precursor monomer—reaction of said transferred dye precursor monomer with a reagent present in said recording element, in said image-receiving element, or in a fluid medium applied to said image-receiving element, to convert said transferred dye precursor monomer into a dye and optionally mordanting said dye.

The present invention also provides a recording element comprising a support having thereon at least one layer of an organic photochemical imaging composition comprising a homogeneously distributed heat-diffusible dye monomer or dye precursor monomer, wherein said heat-diffusible dye monomer or dye precursor monomer is copolymerizable or crosslinkable with said organic photochemical imaging composition upon exposure to actinic radiation to render said dye monomer or dye precursor monomer non-heat-diffusible.

DETAILED DESCRIPTION OF THE INVENTION

Organic photochemical imaging compositions that can be used in carrying out the method of the present invention may be any of the known organic photoreactive non-thermoplastic compositions that by photoinduced polymerization or crosslinking reaction thereof are capable of forming a three-dimensional network pattern with the concurrent copolymerization or crosslinking reaction of said heat-diffusible dye monomer or dye precursor monomer, so that said dye or dye precursor is immobilized or the mobility thereof is at least restricted as a result of said concurrent copolymerization or crosslinking reaction. Such organic photochemical imaging compositions include those based on photoinitiated radical polymerization, photoinitiated cationic ring-opening polymerization, photoinitiated condensation polymerization, and photoinitiated crosslinking.

The organic photoreactive composition on the support of the recording element of the present invention is non-thermoplastic so that at the areas thereof that have not been exposed to an image distribution of actinic radiation said organic photoreactive composition-during overall heating of the recording element while in contact with an image-receiving element-remains on said support but allows diffusion of the heat-diffusible dye monomer or dye precursor monomer to said image-receiving element.

By the term "non-thermoplastic" as used herein is to be understood that the temperature, at which the organic photoreactive composition melts or softens, is higher than the temperature that is necessary to cause diffusion of said heat-diffusible dye monomer or dye precursor monomer to said image-receiving element.

Suitable organic photochemical imaging compositions that can be used in carrying out the method of the present invention are i.a:

organic photoreactive non-thermoplastic compositions comprising an ethylenically unsaturated monomeric, oligomeric, or polymeric component and a photoinitiator for initiating the polymerization of said ethylenically unsaturated monomeric, oligomeric, or polymeric component and the concurrent copolymerization of said heat-diffusible dye monomer or dye precursor monomer, organic photoreactive non-thermoplastic compositions comprising at least one epoxy system and a cationic photoinitiator for initiating the polymerization of said epoxy system and the concurrent copolymerization or crosslinking of said heat-diffusible dye monomer or dye precursor monomer, and organic photoreactive non-thermoplastic compositions comprising at least one polymer carrying photosensitive groups, whose photochemical reactions induce crosslinking of the polymer and concurrent crosslinking of said heat-diffusible dye monomer or dye precursor monomer.

Organic photochemical imaging compositions are well reported in the literature and are commercially available.

Suitable organic photochemical imaging compositions that can be used in carrying out the method of the present invention can be chosen from the many existing organic photoreactive compositions such as those described in "Photoreactive Polymers" by Arnost Reiser, John Wiley & Sons, New York., in a paper entitled "UV curing of epoxides by cationic polymerization" published by William R. Watt in Radiation Curing (November 1986) p. 7-25, in the offprint entitled "Organic photochemical imaging systems" by G. A. Delzenne, from Advances in Photochemistry, Volume 11, Edited by John Wiley in 1979, in "Light-sensitive Systems" by Jaromir Kosar, edited in 1965 by John Wiley & Sons, New York., and in the literature referred to in theses documents.

Suitable organic photoreactive compositions comprising an ethylenically unsaturated monomeric, oligomeric, or polymeric component are those comprising multifunctional (meth)acrylate monomers corresponding to general formula (I):

$$A[-NHCO-X-L_1(-(L_2)_u-OCO-CR_1=CH_2)_n]_m \quad (I)$$

wherein:

n equals 1 or 2, m equals an integer from 3 to 6 when n equals 1 and from 2 to 6 when n equals 2, u equals 0 or 1, X represents —O— or $-NR_2-$, $R_2$ being hydrogen or a lower alkyl group of 1 to 6 carbon atoms, A represents an organic group according to one of the following classes (a) to (d), said organic group being 3- to 6-valent when n equals 1 and being 2- to 6-valent when n is 2:

(a) a hydrocarbon group containing 5 to 25 carbon atoms, which may be interrupted by one or more ether, ester, or amide groups;

(b) $A_1[-(\underset{R_3}{OCH}-\underset{R_4}{CH})_o-OCONH-A_2]_p$ wherein $A_1$ represents a linear or branched-chain aliphatic group that may contain 0 to 3 oxygen atoms and 2 to 20 carbon atoms, an aromatic group containing 6 to 24 carbon atoms, an aromatic/aliphatic group containing 7 to 28 carbon atoms, or a cycloaliphatic group containing 6 to 26 carbon atoms, each of $R_3$ and $R_4$ independently represents a hydrogen or a methyl group, $A_2$ represents a hydrocarbon group containing 5 to 25 carbon atoms, o represents an integer of 0 to 5 and p represents an integer from 2 to 6 when n equals 2 and represents an integer from 3 to 6 when n equals 1;

(c) $A_1[-(\underset{R_3}{OCH}-\underset{R_4}{CH})_o-OCO-A_2]_p$ wherein $A_1$, $A_2$, $R_3$, $R_4$, o and p have the same meaning as defined above;

(d) $A_1[-(\underset{R_3}{OCH}-\underset{R_4}{CH})_o-(G-Q)_r]_p$ wherein $A_1$, $A_2$, $R_3$, $R_4$, o and p have the same meaning as defined above, G represents $-O-CO-NH-Y(-COO-)_q-$ wherein Y represents a divalent aliphatic or alicyclic group containing 2 to 15 carbon atoms and that may contain an ester, ether, or urethan group and q represents 0 or 1, and Q represents a linear or branched-chain aliphatic hydrocarbon group containing 3 to 15 carbon atoms and which may comprise 1 to 3 oxygen bridges and r equals 0 or 1, $L_1$ represents a di- or trivalent aliphatic hydrocarbon group that may comprise 1 to 3 oxygen atoms, $L_2$ represents a lower alkylene of 1 to 6 carbon atoms, which may be branched or linear, and $R_1$ represents hydrogen or a methyl group.

Suitable monomers comprise one of the following groups as hydrocarbon group A of general formula (I):

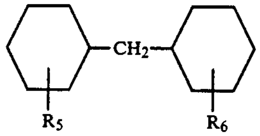

Ia $$-(CH_2)_s-CH-(CH_2)_t- \quad \text{Ib}$$

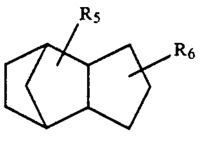

Ic

-continued

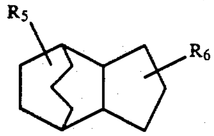

Id wherein each of $R_5$ and $R_6$ independently represents hydrogen or a lower alkyl of 1 to 6 carbon atoms, each of s and t stands for an integer from 1 to 4 and are same or different, and wherein the aliphatic hydrocarbon groups Ia, Ic, and Id comprise 2 to 6 free valencies.

Examples of monomers suitable for use in the method of the present invention are shown in Table 1.

$$CH_3-CH_2-C[CH_2O-(CH_2CH(CH_3)-O)_{2.4}-CO-(CH_2)_5-NHCOO-CH_2-CH_2-CO-C(CH_3)=CH_2]_3 \quad 1$$

$$CH_3-CH_2-C[CH_2O-(CH_2CH(CH_3)-O)_{2.4}-CO-(CH_2)_5-NHCOO-CH-(CH_2-O-CO-C(CH_3)=CH_2)_2]_3 \quad 2$$

$$C[CH_2O-CO-(CH_2)_5-NH-COO-CH_2-CH_2-OCO-CH=CH_2]_4 \quad 3$$

$$C[CH_2O-CO-(CH_2)_5-NH-COO-CH_2-CH_2-OCO-C(CH_3)=CH_2]_4 \quad 4$$

$$[(CH_2=C(CH_3)-COO-CH_2)_2-CH-OOCNH-(CH_2)_5-COO-CH_2]_2C[CH_2-OOC-(CH_2)_5-NHCOO-CH_2-CH_2-OOC-C(CH_3)=CH_2]_2 \quad 5$$

$$[(CH_2=C(CH_3)-COO-CH_2)_2-CH-OOCNH-(CH_2)_5-COO-CH_2]_iC[CH_2-OOC-(CH_2)_5-NHCOO-CH_2-CH_2-OOC-C(CH_3)=CH_2]_j \quad 6$$

i and j represent 3.5 and 0.5 respectively, meaning that compound 6 is a mixture of compounds obtained by reacting i equivalents of glycerine-dimethacrylate and j equivalents of hydroxyethyl methacrylate as disclosed in DE 3,703,103, $$[(CH_2=C(CH_3)-COO-CH_2)_2CH-OOCNH-(CH_2)_5COO-CH_2]_iC[CH_2-OOC(CH_2)_5-NHCOO-CH_2-CH_2-OOC-C(CH_3)=CH_2]_j \quad 7$$

i and j are 2.5 and 1.5 respectively, indicating that compound 7 is a mixture of compounds obtained by reacting i equivalents of glycerine-dimethacrylate and j equivalents of hydroxyethylmethacrylate as disclosed in DE 3,703,130, $$C[CH_2O-CO(CH_2)_5-NH-COO-CH-(CH_2-O-CO-C(CH_3)=CH_2)_2]_4 \quad 8$$

$$(CH_2=C(CH_3)-COO-CH_2)_2-CH-OOCNH-(CH_2)_5-CO-(O-CH(CH_3)CH_2)_{2.4}-O-CH_2-C(C_2H_5)[CH_2-O-(CH_2CH(CH_3)-O)_{2.4}-OC-(CH_2)_5-NHCOO-CH_2-CH_2-OOC-C(CH_3)=CH_2]_2 \quad 9$$

$$CH_3-CH_2-C[CH_2O-(CH_2CH(CH_3)-O)_{2.4}-CO-(CH_2)_5-NHCOO-CH_2-CH_2-O-CO-CH=CH_2]_3 \quad 10$$

$$C[CH_2O-CO-NH-CH_2-C(CH_3)_2-CH_2-CH(CH_3)-CH_2-CH_2-NH-COO-CH-(CH_2-O-CO-C(CH_3)=CH_2)_2]_4 \quad 11$$

$$C[CH_2O-CO-NH-(CH_2)_6-NH-COO-CH-(CH_2-O-CO-C(CH_3)=CH_2)_2]_4 \quad 12$$

$$C_2H_5-C[CH_2O-CO-NH-(CH_2)_6-NH-COO-CH-(CH_2-O-CO-C(CH_3)=CH_2)_2]_3 \quad 13$$

-continued
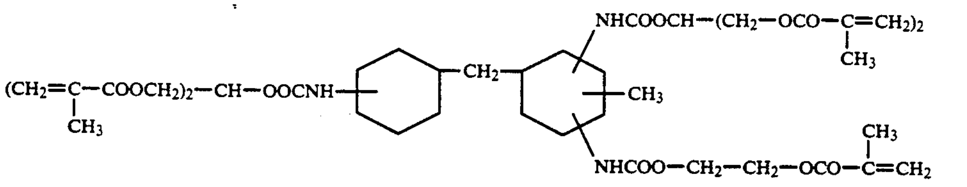
14
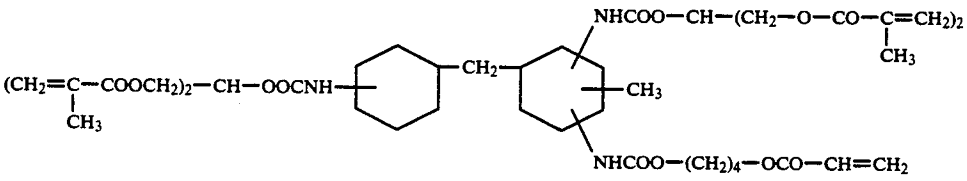
15
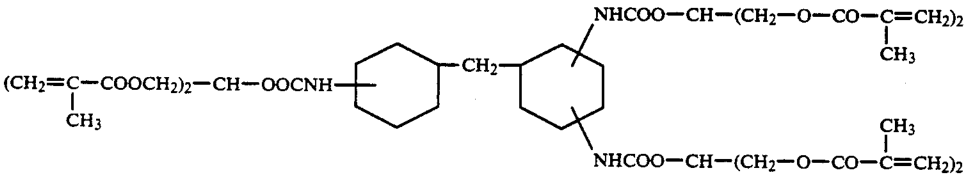
16
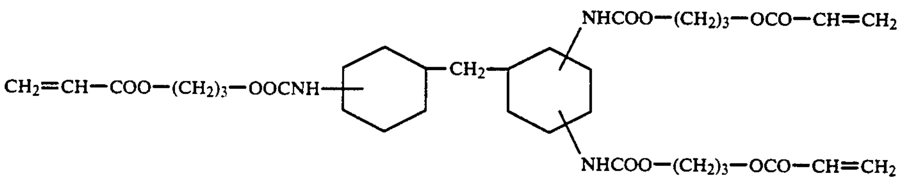
17
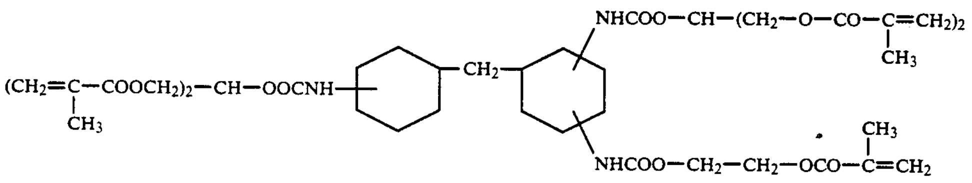
18
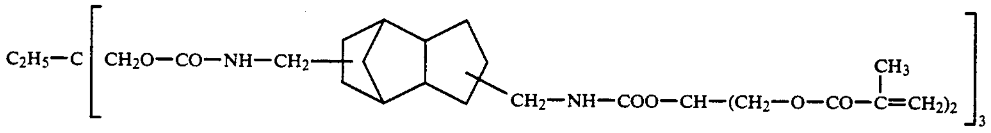
19
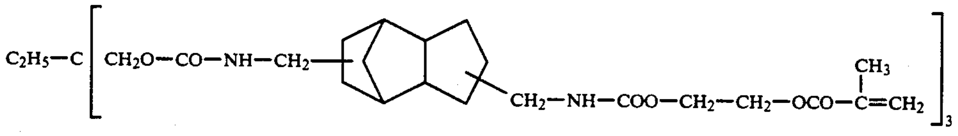
20
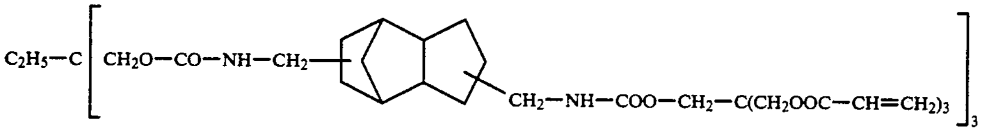
21
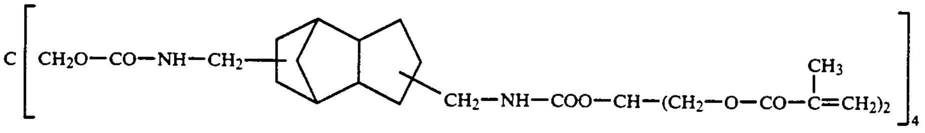
22

-continued

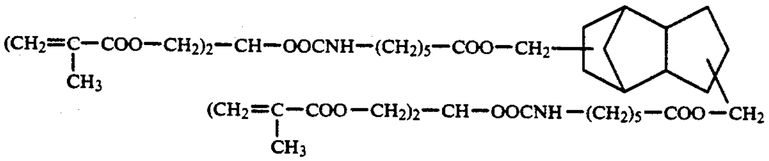
23

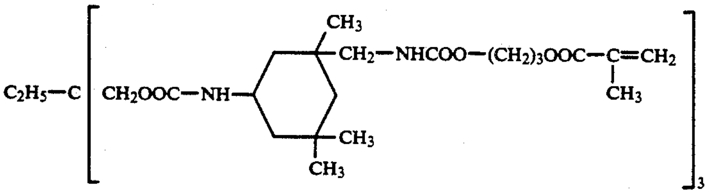
24

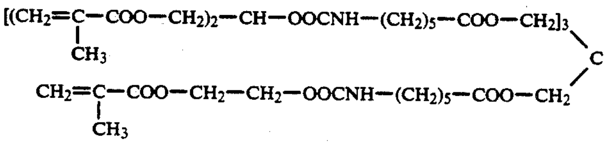
25

The fractal indexes in the formulae 1, 2 and 10 indicate that these formulae represent a mixture of compounds having a different length of the ethylene oxide group in said formulae, the indexes thus representing an average of said ethylene oxide group. The formulae 14 to 23 represent a mixture of structural isomers and can be used in the method of the present invention without separation of the isomers.

It has been found that the monomers corresponding to general formula (I) show a high polymerization rate and solidify even at conversions of as low as 10%, thus allowing a rapid differentiation between exposed and non-exposed parts. The monomers corresponding to general formula (I) are known and can be prepared according to the methods disclosed in the German patent applications numbers 3,522,005, 3,703,080, 3,643,216, 3,703,130, 3,703,080, 3,917,320, and 3,743,728.

Other suitable organic photoreactive compositions comprising an ethylenically unsaturated monomeric, oligomeric, or polymeric component are those comprising at least one monomer corresponding to general formula (II):

$$Z[-R_7-NHCO-D-R_8(-OCO-CR_9=CH_2)_a]_b \quad (II)$$

wherein:

Z represents a di- or trivalent condensed urea group,

D is —O— or $-NR_{10}$, $R_{10}$ standing for a $C_1$–$C_{12}$-alkyl group, $R_7$ is a divalent hydrocarbon group having from 2 to 25 carbon atoms, $R_8$ is a 2- to 6-valent linear or branched-chain hydrocarbon group having from 2 to 18 carbon atoms, which hydrocarbon group may be interrupted by up to 3 oxygen atoms, $R_9$ is hydrogen or methyl, a is an integer from 1 to 5, preferably 2 or 3, and b is 2 or 3.

Examples of di- or trivalent condensed urea groups represented by Z in general formula II are the following structural groups:

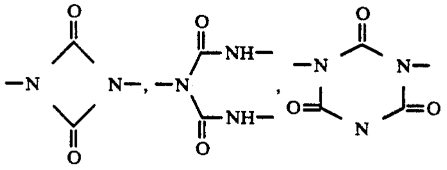

Preferably, the divalent group D is oxygen (—O—), but in case D stands for $-NR_{10}$, $R_{10}$ stands for a linear or branched-chain alkyl group e.g. methyl, ethyl, propyl, and t-butyl.

The divalent hydrocarbon group having from 2 to 25 carbon atoms, represented by $R_7$, may be interrupted by oxygen, the hydrocarbon group being an aliphatic, aromatic, or mixed aliphatic/aromatic hydrocarbon group. Examples are ethylene, propylene, 1,4-tetramethylene, 1,6-hexamethylene, 2,2,4-trimethyl-1,6-hexamethylene, and isomers thereof. $R_7$ can also be a mono- or polycyclic saturated or aromatic hydrocarbon group having from 6 to 24 carbon atoms, preferably 6 to 14 carbon atoms. Examples thereof are groups having the following structural formulae:

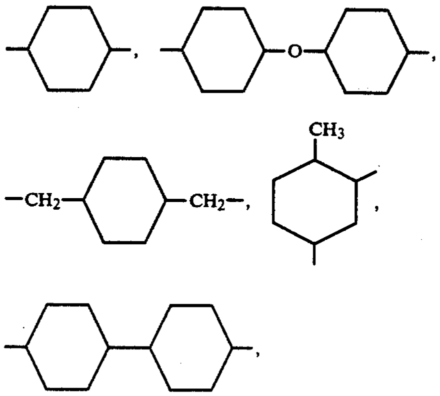

-continued
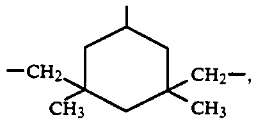
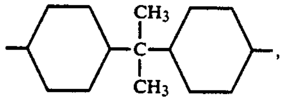
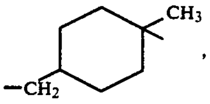
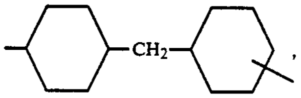
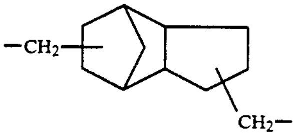
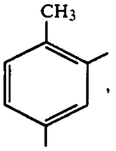
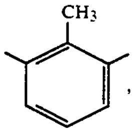
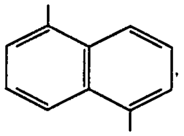
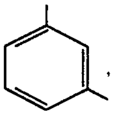
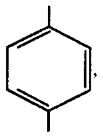
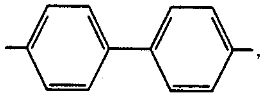
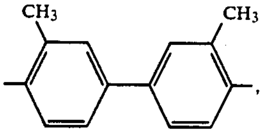
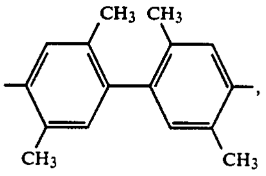
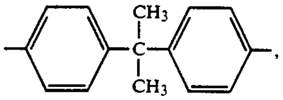
-continued
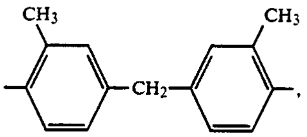
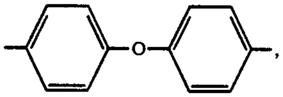
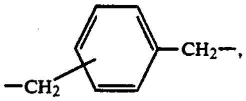
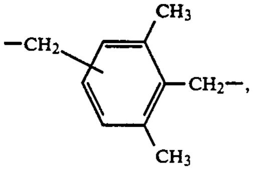
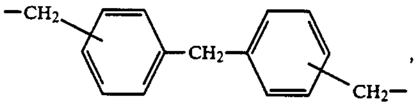
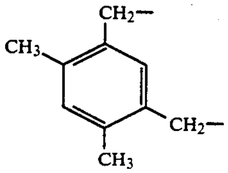
The hydrocarbon group represented by $R_8$ preferably is a 2- to 4-valent group having from 2 to 12 carbon atoms. Examples thereof are ethylene, propylene, 1,2-butylene, and groups having the following structural formulae:
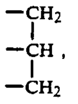
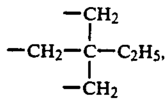
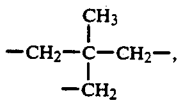
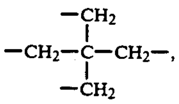
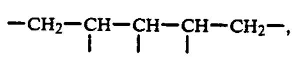
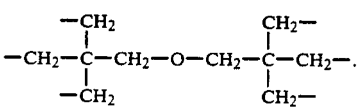
Examples of monomers corresponding to general formula (II) are the following structures M-1 to M-7:

M-1
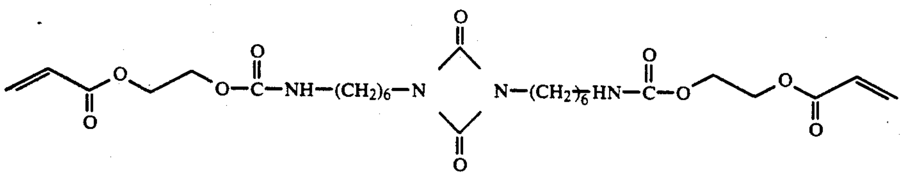
M-2
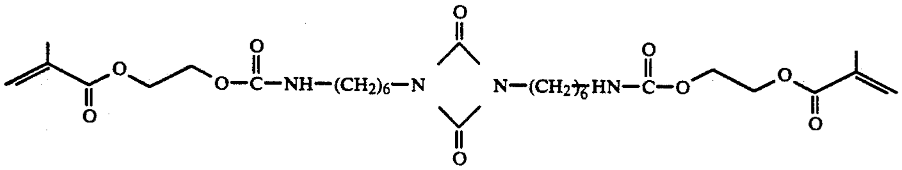
M-3
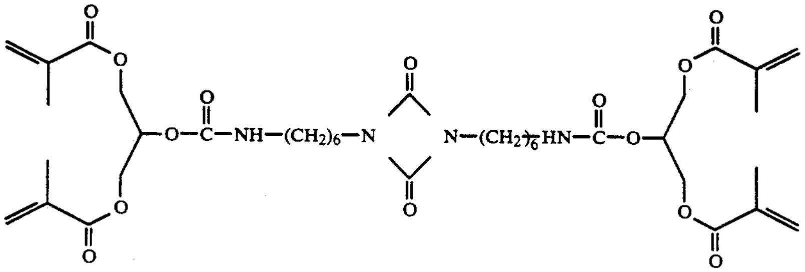
M-4
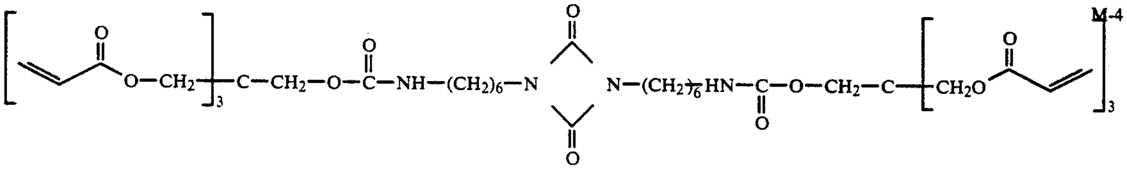
M-5
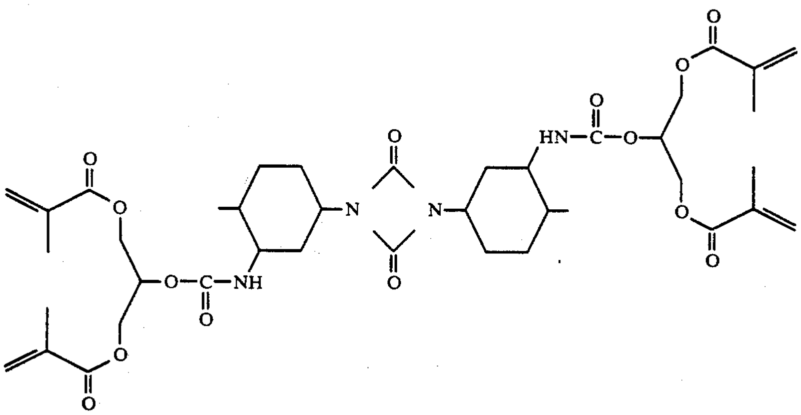
M-6
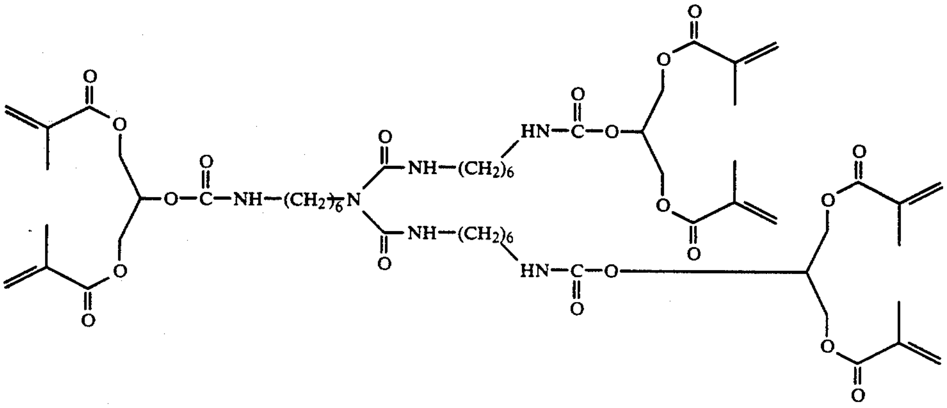

-continued

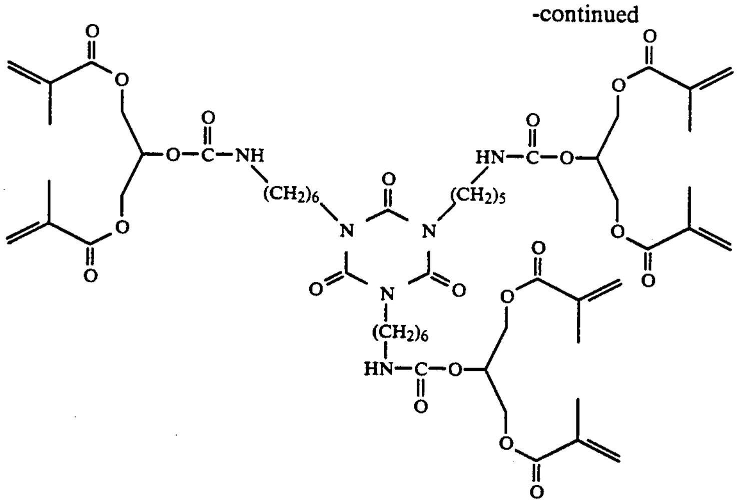

M-7

The synthesis of the components comprising at least one monomer corresponding to general formula (II) can be performed as described in the German Patent Application 4,129,284.7 filed Sep. 3, 1991.

Other types of monomers suitable for use in the organic photoreactive non-thermoplastic compositions used in accordance with the present invention are e.g. the monomers disclosed in DEOS no. 4,005,231, 3,516,256, 3,516,257 and 3,632,657, unsaturated esters of polyols, particularly such esters of the alpha-methylene carboxylic acids e.g. ethylene diacrylate, glycerol tri(meth)acrylate, ethylene dimethacrylate, 1,3-propanediol di(meth)acrylate 1,2,4-butanetriol tri(meth)acrylate, 1,4-cyclohexanediol di(meth)acrylate, 1,4-benzenediol di(meth)acrylate, pentaerythritol tetra(meth)acrylate, 1,5-pentanediol di(meth)acrylate, the bis-acrylates and methacrylates of polyethylene glycols of molecular weight 200–500, unsaturated amides, particularly those of the alphamethylene carboxylic acids, and especially those of alpha-omega-diamines and oxygen-interrupted omega-diamines such as methylene bis-acrylamide, methylene bis-methacrylamide, 1,6-hexamethylene bis-acrylamide, diethylene triamine tris-methacrylamide, bis(gamma-methacrylamidopropoxy)ethane, beta-methacrylamidoethyl methacrylate, N-(beta-hydroxyethyl)-beta-(methacrylamido)ethyl acrylate and N,N-bis(beta-methacrylolyoxyethyl)acrylamide; vinyl esters e.g. divinyl succinate, divinyl adipate, divinyl phthalate, divinyl butane-1,4-disulfonate; and unsaturated aldehydes, e.g. sorbaldehyde (hexadienal). The organic photoreactive non-thermoplastic composition may also comprise polymers and/or oligomers comprising 2 or more polymerizable functions e.g. acrylated epoxies, polyester acrylates, and urethane acrylates. It will be clear that these monomers and/or polymers and/or oligomers can be used in admixture.

For carrying out the method of the present invention use is thus made of a recording element comprising a said organic photochemical imaging composition in which polymerization or crosslinking of an organic photoreactive composition and concurrent copolymerization or crosslinking of a said heat-diffusible dye monomer or dye precursor monomer are brought about in an image-wise fashion when exposed to an image-wise distribution of actinic radiation.

The heat-diffusible dye monomer or dye precursor monomer used in the method of the present invention can be any dye or dye precursor that in a sidechain of its molecule includes at least one ethylenically unsaturated group and/or at least one epoxy group, said group(s) being copolymerizable or crosslinkable with said organic photoreactive composition and being capable of diffusing under the influence of heat. Many of the known heat-diffusible dyes or dye precursors can be converted into heat-diffusible dye monomers by building in at least one ethylenically unsaturated group and/or at least one epoxy group.

Examples of suitable heat-diffusible dye monomers or dye precursor monomers can be found e.g. in GB-A 1,130,581, in GB-A 2,159,971, in DE-A 2,946,965, in DE-A 2,803,422, in Eur. Polym. J. Vol. 23, (1987) No. 8, pages 617–622, in Pure & Appl. Chem., Vol. 52, (1980) Pergamon Press Ltd., pages 1923–1928, in Acta Polymerica 38 (1987) No. 12, pages 643–647, and in Double Liaison-Chim. Peint. 1978, 25 (273), pages 190–4, and in EP-A 384,989.

Examples of suitable heat-diffusible dye monomers that were used in the tests described in the Examples 1 to 3 hereinafter for illustrative purposes are the dyes corresponding to the following structural formulae:

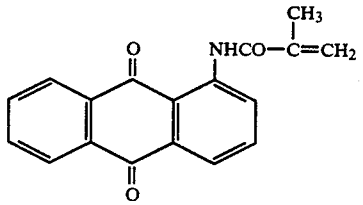

D01

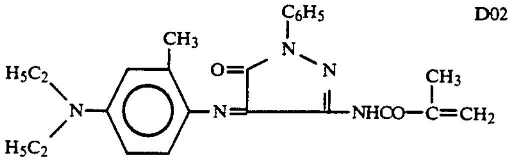

D02

-continued

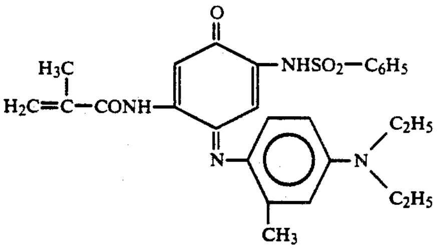

D03

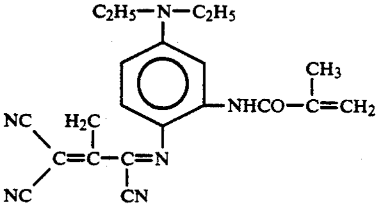

D04

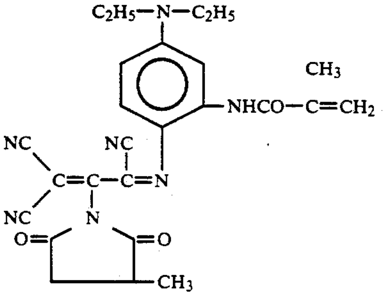

D05

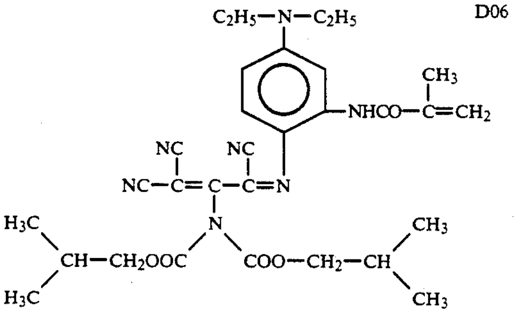

D06

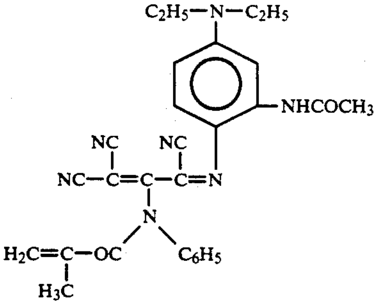

D07

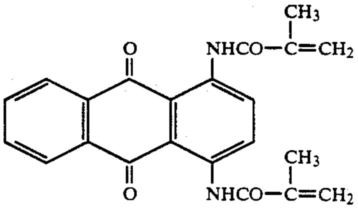

D08

-continued

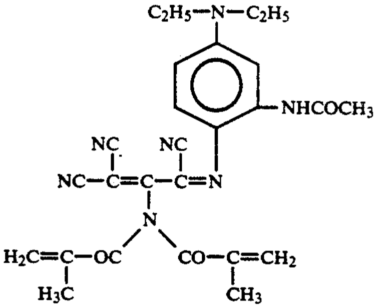

D09

The heat-diffusible dye precursor monomer is a compound that, although initially being uncoloured or only slightly coloured, is capable of forming a colour as a result of a reaction with another reagent that is made available at the moment such colour-forming reaction is required. The heat-diffusible dye precursor monomer can be e.g. a heat-diffusible colour former having a built-in ethylenically unsaturated group as used in silver halide colour photography to form polymeric colour couplers, which are capable of forming a colour as a result of coupling with an oxidized photographic developing agent e.g. p-phenylene diamine or a derivative thereof. The heat-diffusible dye precursor monomer can also be e.g. a leucobase dye precursor monomer having at least one built-in copolymerizable or crosslinkable group e.g. an ethylenically unsaturated group or an epoxy system, said leucobase dye precursor monomer being capable of forming a colour as a result of reaction with acid reagents or acid groups such as with e.g. dye-developing vinyl copolymers having sulphonic acid side-groups, which have been described in EP-A 384,989. The dye-developing vinyl copolymer(s) can be present in any of the layers of the image-receiving element. There are many other reagents that can be used for entering into reaction with the heat-diffusible dye precursor monomer to form a dye. Examples of such reagents are zinc oxide, calcium sulphate, novolac-type phenol resins, and zinc-3,5-dimethyl-tert.butyl salicylate.

Suitable heat-diffusible dye precursor monomers have been described in i.a. U.S. Pat. No. 3,073,699 and GB-A 2,159,971.

Examples of suitable heat-diffusible dye precursor monomers that were used in the tests described in the Examples 4 to 8 hereinafter for illustrative purposes are the dyes corresponding to the following structural formulae:

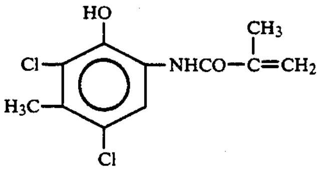

DP01

-continued

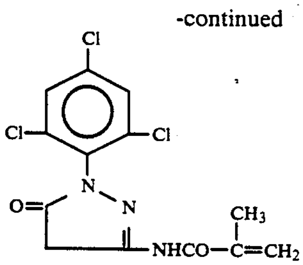

DP02

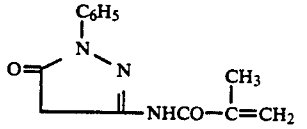

DP03

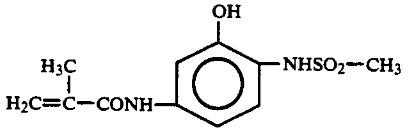

DP04

The photoinitiator that can be used in carrying out the method of the present invention can be chosen from the known initiators such as those described in the above-mentioned documents "Photoreactive Polymers" by Arnost Reiser, "Organic photochemical imaging systems" by G. A. Delzenne, in the paper "UV-Curing Chemistry: Past, Present, and Future" by Christian Decker, published in J. of Coatings Technology, Vol. 59, No 751, August 1987, pages 97-106, in EP-A 362,827, and in U.S. Pat. No. 3,558,309.

The organic photoreactive compositions, which may include a photoinitiator, can be provided on the support of the recording element used in the method of the present invention at coating ratios commonly employed in the art. The photoinitiator is usually present at a ratio of 0.1 to 30 parts by weight calculated on the total weight of the organic photoreactive composition.

The amount of heat-diffusible dye monomer or dye precursor monomer present in the layer of organic photochemical imaging composition coated on the support of the recording element may vary between wide limits, but is in general comprised between 2.5 and 30% by weight of the total weight of said layer in dry condition.

The layer of organic photochemical imaging composition comprising the heat-diffusible dye monomer dye precursor monomer in homogeneously distributed state can be formed by dissolving the organic photoreactive composition, the heat-diffusible dye monomer or dye precursor monomer, and optionally a binder in a solvent and coating the solution obtained on the support. The resulting coated layer usually has a thickness of 0.1 μm to 100 μm, preferably of 1 μm to 20 82 m.

Any material can be used as the support for the recording element provided it is:

dimensionally stable, capable of withstanding the temperatures of overall heating involved, capable of transmitting sufficient heat to the-heat-diffusible dye nonomer or dye precursor monomer that remained unmodified after said exposure to actinic radiation to effect transfer thereof to the image-receiving element.

Such materials include polyesters such as polyethylene terephthalate, polyamides, polyacrylates, polycarbonates, polyvinyl chloride, cellulose esters, fluorinated polymers, polyethers, polyacetals, polyolefins, polyimides, glassine paper, and condenser paper. Preference is given to a support comprising polyethylene terephthalate. In general, the support has a thickness of 2 μm to 1 mm, preferably of 50 to 200 μm. If desired, the support can be coated with an adhesive or subbing layer.

In case the organic photochemical imaging composition and/or the the heat-diffusible dye monomer or dye precursor monomer have no satisfactory layerforming capacity, a binder may be added thereto in an amount that provides sufficient layer strength.

The binder can be chosen from the polymeric binders known for that purpose in organic photochemical imaging compositions e.g. the binders described in EP-A 384,040.

The recording element may also comprise in the layer of organic photochemical imaging composition or in a layer adjacent thereto other components such as e.g. sensitizing agents, curing agents, preservatives, slip additives, and other ingredients, which have been described exhaustively in EP-A 133,011, EP-A 133,012, and EP-A 111,014. Suitable slip additives are i.a liquid or solid lubricants and surface-active agents. Preferred slip additives are e.g. surfactants containing fluorine or phosphate groups, polyethylene wax, amide wax, Teflon powder, polysiloxane polyether copolymer, silicon oils, more preferably hardenable silicon oils.

The recording element is exposed to an image-wise distribution of actinic radiation to create therein an impermeability pattern corresponding to said image-wise distribution of actinic radiation. The exposure can be contact evposure using e.g. ultraviolet radiation, a camera exposure, a scanning exposure, or a laser exposure. The radiation source used in carrying out the exposure step includes e.g. sunlight, incandescent lamps, mercury vapour lamps, halogen lamps, xenon lamps, fluorescent lamps, light-emitting diodes, lasers, electron rays, and X-rays.

After the exposure of the recording element to an image-wise distribution of actinic radiation and the resulting creation in said layer of a change in its permeability corresponding to said image-wise distribution of actinic radiation, the recording element is brought into contact with an image-receiving element. Overall heating of at least one of the contacting elements is then performed up to a temperature, at which the unmodified heat-diffusible dye monomer or dye precursor monomer diffuses into said image-receiving element, but at which the organic photoreactive composition remains on the support of the recording element. The resulting dye image in the image-receiving element may be the final image. If desired, however, the dye monomer diffused into the image-receiving element may be mordanted or fixed therein with the aid of mordanting agents or of thermally or photochemically active cross-linking agents contained in the image-receiving element so as to form a stable dye image. In case the resulting image is a dye precursor monomer image, the dye precursor monomer diffused into the image-receiving element is caused to react with at least one reagent present in said recording element, in said image-receiving element, or in a fluid medium applied to said image-receiving element, so as to convert said dye precursor monomer into a dye. Optionally, the latter dye may still be mordanted with the aid of mordanting agents or cross-linking agents contained in the image-receiving element.

The said at least one reagent used for reacting with said dye precursor monomer may be any compound that is capable of converting said diffused dye precursor monomer into a dye. For instance, when the diffused dye precursor monomer is a colour former having at least one built-in ethylenically unsaturated group, said reagent may be a photographic developing agent e.g. a p-phenylene diamine developing agent or a derivative thereof. A dye image can then be formed as a result of the coupling reaction between the diffused dye precursor monomer and the oxidized p-phenylene diamine developing agent. The photographic developer may be applied in the form of an aqueous alkaline bath onto the image-receiving element comprising the diffused dye precursor monomer. Alternatively, the developing agent may be incorporated into a special layer provided between the support and the layer of organic photochemical imaging composition of the recording element or on top of the layer of organic photochemical imaging composition. In the latter case the dye precursor is developed during the thermal diffusion through the action of the developing agent present, the atmospheric oxygen presumably acting as oxidant during the colour reaction. Other oxidants such as e.g. quinone, iron (III) acetyl acetonate, iron (III) stearate, copper (II) acetate, and iodobenzene diacetate can be used as oxidant instead of atmospheric oxygen. Any of such other oxidants can be incorporated into one of the layers of the recording element or the image-receiving element. Furthermore, it is also possible to incorporate the developing agent in a layer of the image-receiving element.

There are many other reagents that can be used for entering into reaction with the heat-diffusible dye precursor monomer to form a dye. Examples of such reagents are zinc oxide, calcium sulphate, novolac-type phenol resins, and zinc-3,5-dimethyl-tert.butyl salicylate.

The support of the image-receiving element for use in the method of the present invention may be a transparent film made of e.g. a polyethylene terephthalate, polycarbonate, polyvinyl chloride, a polyether sulfone, a polyimide, a cellulose ester, or a polyvinyl alcohol-coacetal. The support may also be a reflecting one such as paper e.g. top quality paper, art paper, cellulose fiber paper, baryta-coated paper, polyethylene- or polypropylenecoated paper, and synthetic paper; polystyrene, white polyester i.e. whitepigmented polyester, white polyvinyl chloride, white polycarbonate, and white polyethylene or polypropylene.

To avoid poor adsorption of the diffusing dye monomer or dye precursor monomer, the support of the image-receiving element may be coated with a special surface, generally known as dye-image-receiving layer, into which the dye monomer or dye precursor monomer can diffuse more readily. Suitable dye-image-receiving layers have been described in e.g. EP-A 133,011, EP-A 133,012, EP-A 144,247, EP-A 227,094, and EP-A 228,066.

The dye-image-receiving layer may be present on the support in any amount that is effective for the intended purpose. In general, favourable results are obtained at concentrations of from about 1 to about 10 g/m2.

UV-absorbers and/or antioxidants may be incorporated into the dye-image-receiving layer for improving the fastness to light and other stabilities of the recorded image.

A releasing agent that aids in separating the image-receiving element from the recording element after transfer can be present in the dye-image-receiving layer or in a separate layer of the image-receiving element. Solid waxes, fluorine- or phosphate-containing surfactants, silicon oils, more preferably hardenable silicon oils, and polysiloxane polyether copolymers can be used as releasing agent. A suitable releasing agent has been described in e.g. EP-A 133,012, JP 85/19138, and EP-A 227,092.

The recording element of the present invention is used to form a thermal transfer dye image by a process comprising placing the recording element, subsequent to the formation therein of an impermeability pattern as above described, with its side carrying said layer comprising the homogeneously distributed heat-diffusible dye monomer or dye precursor monomer in face-to-face relationship with the dye-image-receiving layer of the image-receiving element and overall heating at least one of said contacting elements to cause the heat-diffusible dye monomer or dye precursor monomer to diffuse from the areas having unchanged permeability and transfer to said image-receiving element. The transfer of the dye monomer or dye precursor monomer is accomplished by heating to a temperature that does not have to be as high as in the conventional thermosublimation transfer methods using a thermal head. The heating temperature may vary between 50° and 300° C., but preferably is comprised between 80° and 180° C. The heating elements can be chosen glazing elements, flat or curved heating surfaces or platens, roll laminator devices, radiant sources, and laser sources. The heating time may vary between 0.01 and 20 s, preferably between 0.5 and 10 s.

When the dye transfer is performed for but one single colour, a monochrome dye transfer image is obtained. A multicolour image can be obtained by using a recording element containing three or more primary colour dyes and sequentially performing the process steps described above for each colour.

The method of the invention can be used for making dye images, contact proofing images, digital proofing images, ID-cards, security cards, continuous tone images, screened or halftone images, etc.

The following examples illustrate the present invention.

EXAMPLE 1

A subbed polyethylene terephtalate support having a thickness of 100μm was coated by means of a knife coater with an organic photochemical imaging composition consisting of mixture of 10 g of a solution in methylene chloride of 10% by weight of pentaerythritol tetraacrylate, 10% by weight of co(styreneacrylonitrile) comprising 104 styrene units and 53 acrylonitrile units, which copolymer is sold under the trade mark LURAN 378 P by BASF AG, D-6700 Ludwigshafen, Germany, 2% by weight of the above-defined heat-diffusible dye monomer D01, and 0.2% by weight of a polysiloxane polyether copolymer sold under the trade mark TEGOGLIDE 410 by TH. GOLDSCHMIDT AG, D-4300 Essen 1, Goldschmidtstrasse 100, Germany, with 10 g of a solution in methylene chloride of 7% by weight of bis-imidazole, 0.2% by weight of Michler's ketone, and 0.4% by weight of mercaptobenzoxazole. The mixture was coated to form a layer having a thickness in wet condition of 50 μm. The resulting layer was dried.

The recording element thus made was placed in contact with a test target and exposed therethrough to ultraviolet radiation.

The exposed recording element was then placed in face-to-face contact with a commercially available Mitsubishi CK100S paper image-receiving element.

The contacting elements were conveyed through a roll laminator device at about 180° C. and a speed of 0.006 m/s, the temperature within the contacting elements then being about 120° C. Next, the elements were peeled apart.

The image-receiving element showed a yellow thermal transfer dye image having good quality and having a maximum density (Dmax) of 1.28 and a minimum density (Dmin) of 0.22 as measured through a blue filter in a Macbeth densitometer RD919 in Status A mode, the density of the image-receiving element before transfer of dye thereto already being 0.11.

EXAMPLE 2

A recording element was made analogously as described in Example 1 with the only difference that 2% by weight of the above-defined heat-diffusible dye monomer D02 was used instead of the dye monomer D01. The recording element obtained (Invention recording element A) was then subjected to the procedure of exposure, heating in contact with an image-receiving element, and peeling apart as described in Example 1.

The image-receiving element showed a magenta thermal transfer dye image having good quality and having a Dmax of 1.42 and a Dmin of 0.27 as measured through a green filter in a Macbeth densitometer RD919 in Status A mode, the density of the image-receiving element before transfer of dye thereto already being 0.09.

For comparison with the above results obtained according to the method of the present invention a recording element (Comparison recording element A) was made exactly as described for the Invention recording element A with the only difference that instead of the heat-diffusible dye monomer D02 a common heat-diffusible dye C01 having no copolymerizable or cross-linkable ethylenically unsaturated group and corresponding to the following structural formula was used:

C01

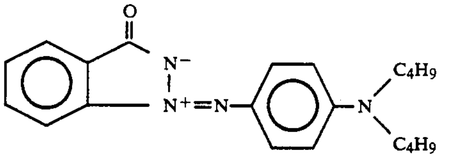

The Comparison recording element A was subjected to the above-described procedure followed for the Invention recording element A.

The image-receiving element showed a magenta thermal transfer dye image having a Dmax of 1.00 and a Dmin of 0.56 measured as described above. It is seen that a high level of unwanted fog was present in the background areas.

EXAMPLE 3

A recording element was made analogously as described in Example 1 with the only difference that 2% by weight of the above-defined heat-diffusible dye monomer D03 was used instead of the dye monomer D01. The recording element obtained (Invention recording element B) was then subjected to the procedure of exposure, heating in contact with an image-receiving element, and peeling apart as described in Example 1.

The image-receiving element showed a cyan thermal transfer dye image having a Dmax 0.86 and a Dmin 0.29 as measured through a red filter in a Macbeth densitometer RD919 in Status A mode, the density of the image-receiving element before transfer of dye thereto already being 0.08.

For comparison with the above results obtained according to the method of the present invention a recording element (Comparison recording element B) was made exactly as described for the Invention recording element B with the only difference that instead of the heat-diffusible dye monomer D03 a common heat-diffusible dye C02 having no copolymerizable or cross-linkable ethylenically unsaturated group and corresponding to the following structural formula was used:

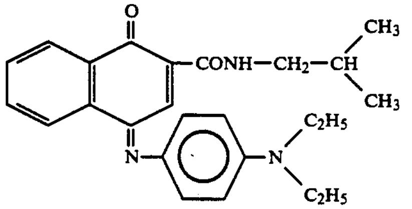

The Comparison recording element B was subjected to the above-described procedure followed for the Invention recording element B.

The image-receiving element showed a cyan thermal transfer dye image having a Dmax of 0.90 and a Dmin of 0.54 measured as described above. It is seen that a high level of unwanted fog was present in the background areas.

EXAMPLE 4

A recording element was made analogously as described in Example 1 with the only difference that 2% by weight of the above-defined heat-diffusible dye monomer D04 was used instead of the dye monomer D01. The recording element obtained was subjected to the procedure of exposure, heating in contact with an image-receiving element, and peeling apart as described in Example 1.

The image-receiving element showed a magenta thermal transfer dye image having a Dmax of 0.95 and a Dmin of 0.13 as measured through a green filter in a Macbeth densitometer RD919 in Status A mode, the density of the image-receiving element before transfer of dye thereto already being 0.09.

The procedure described in this Example was repeated with identical recording elements as described in this same Example, except that they contained the dye monomers indicated in Table 2 hereinafter instead of the heat-diffusible dye monomer D04. The results are listed in Table 2 and the colour of the filter, through which the density values have been measured, is given as well.

TABLE 2

| Dye monomer | colour of dye | Dmax | Dmin | Colour of filter |
|---|---|---|---|---|
| D05 | cyan | 0.83 | 0.24 | red |
| D06 | cyan | 1.05 | 0.27 | red |
| D07 | cyan | 0.92 | 0.24 | red |
| D08 | orange | 0.75 | 0.24 | blue |

TABLE 2-continued

| Dye monomer | colour of dye | Dmax | Dmin | Colour of filter |
|---|---|---|---|---|
| D09 | cyan | 1.09 | 0.22 | red |

EXAMPLE 5

A recording element was made analogously as described in Example 1 with the only difference that 2% by weight of the above-defined heat-diffusible dye monomer precursor DP01 was used instead of the dye monomer D01. The recording element obtained was then subjected to the procedure of exposure, heating in contact with an image-receiving element, and peeling apart as described in Example 1.

The image-receiving element showed a faint cyan dye precursor image. The dye precursor image was then first immersed for 2 min in an aqueous alkaline solution (pH 10.5) comprising 3 g of p-phenylene diamine developing agent, 4 g sodium sulphite, and 15 g of sodium carbonate per liter and next for about 2 min in an aqueous alkaline oxidizing solution (pH 10) comprising 10 g of potassium persulphate per liter.

The thus treated image-receiving element showed a cyan dye image having good quality and having a Dmax of 0.87 and a Dmin of 0.12 as measured through a red filter in a Macbeth densitometer RD919 in Status A mode, the density of the image-receiving element before transfer of dye thereto already being 0.08.

EXAMPLE 6

A recording element was made analogously as described in Example 5 with the only difference that the heat-diffusible dye monomer precursor DP02 was used instead of the dye monomer precursor DP01. The recording element obtained was subjected to the procedure of exposure, heating in contact with an image-receiving element, and peeling apart as described in Example 1. Next, the image-receiving element showing a faint magenta dye precursor image was treated with the developing solution and the oxidizing solution exactly as described in Example 5.

The thus treated image-receiving element showed a magenta dye image having good quality.

EXAMPLE 7

A recording element was made analogously as described in Example 5 with the only difference that the heat-diffusible dye monomer precursor DP03 was used instead of the dye monomer precursor DP01. The recording element obtained was subjected to the procedure of exposure, heating in contact with an image-receiving element, and peeling apart as described in Example 1. Next, the image-receiving element showing a faint magenta dye precursor image was treated with the developing solution and the oxidizing solution exactly as described in Example 5.

The thus treated image-receiving element showed a magenta dye image having good quality and having a Dmax of 0.75 and a Dmin of 0.10.

EXAMPLE 8

A recording element was made analogously as described in Example 5 with the only difference that the heat-diffusible dye monomer precursor DP04 was used instead of the dye monomer precursor DP01. The recording element obtained was subjected to the procedure of exposure, heating in contact with an image-receiving element, and peeling apart as described in Example 1. Next, the image-receiving element showing a faint cyan dye precursor image was treated with the developing solution and the oxidizing solution exactly as described in Example 5.

The thus treated image-receiving element showed a cyan dye image having good quality.

EXAMPLE 9

A subbed polyethylene terephtalate support having a thickness of 100 μm was coated with a layer having a thickness of 50 μm while in wet condition, the layer being coated from an aqueous solution comprising 1% by weight of polyvinyl alcohol and 0.5% of p-phenylene diamine and having a pH-value of 10.5.

After drying, the resulting "developer" layer was coated with an organic photochemical imaging composition made analogously as described in Example 1 with the only difference that 2% by weight of the heat-diffusible dye monomer precursor DP01 was used instead of the dye monomer D01. The recording element was dried and subjected to the procedure of exposure, heating in contact with an image-receiving element, and peeling apart as described in Example 1.

It has been established that during the heating step in the roll laminator device the dye monomer precursor DP01 while diffusing into the image-receiving layer is developed by the developing agent present in the "developer" layer to form a cyan dye image in the image-receiving layer. It is presumed that atmospheric oxygen acts as oxidizing agent during the colour reaction. A cyan dye image having good quality was obtained.

We claim:

1. Method of forming thermal transfer dye images comprising the steps of:

exposing a recording element comprising a support having thereon at least one layer of an organic photochemical imaging composition comprising a homogeneously distributed heat-diffusible dye monomer or dye precursor monomer and a member selected from the group consisting of (a) organic photoreactive non-thermoplastic compositions comprising an ethylenically unsaturated monomeric, oligomeric, or polymeric component and a photoinitiator for initiating the polymerization of said ethylenically unsaturated monomeric, oligomeric, or polymeric component and the concurrent copolymerization of said heat-diffusible dye monomer or dye precursor monomer, (b) organic photoreactive non-thermoplastic compositions comprising at least one epoxy system and a cationic photoinitiator for initiating the polymerization of said epoxy system and the concurrent copolymerization or crosslinking of said heat-diffusible dye monomer or dye precursor monomer, and (c) organic photoreactive non-thermoplastic compositions comprising at least one polymer carrying photosensitive groups, whose photochemical reactions induce cross-linking of the polymer and concurrent crosslinking of said heat-diffusible dye monomer or dye precursor monomer, said at least one layer being permeable to said dye monomer or dye precursor monomer, to an image-wise distribution of actinic radiation to create in said layer a change in its permeability corresponding to said image-wise distribution of actinic radiation, wherein said change in permeability is brought about by the radiation-induced polymerization or crosslinking reaction of said organic photochemical imaging composition combined with a concurrent copolymerization or crosslinking reaction of said heat-diffusible dye monomer or dye precursor monomer, bringing said recording element having an image-wise changed permeability into contact with an image-receiving element, overall heating of at least one of said contacting elements to cause the heat-diffusible dye monomer or dye precursor monomer to diffuse from the areas having unchanged permeability and transfer to said image-receiving element, and when—in the case of said dye precursor monomer is present a reaction of said transferred dye precursor monomer with a reagent present in said recording element, in said image-receiving element, or in a fluid medium applied to said image-receiving element, to convert said transferred dye precursor monomer into a dye.

2. A method according to claim 1, wherein said overall heating is performed at a heating temperature comprised between 80° and 180° C.

3. The method of claim 1 wherein the transferred dye monomer on said image-receiving element is mordanted, and said dye is mordanted.

* * * * *